(12) United States Patent
Kim et al.

(10) Patent No.: US 7,800,946 B2
(45) Date of Patent: Sep. 21, 2010

(54) FLASH MEMORY DEVICE AND OPERATING METHOD THEREOF

(75) Inventors: Nam Kyeong Kim, Icheon-si (KR); Ju Yeab Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 118 days.

(21) Appl. No.: 12/130,906

(22) Filed: May 30, 2008

(65) Prior Publication Data
US 2009/0161432 A1 Jun. 25, 2009

(30) Foreign Application Priority Data
Dec. 24, 2007 (KR) ...................... 10-2007-0136299

(51) Int. Cl.
*G11C 16/04* (2006.01)
(52) U.S. Cl. ..................... 365/185.11; 365/185.19; 365/185.18; 365/185.2
(58) Field of Classification Search ............ 365/185.11, 365/185.19, 185.18, 185.2
See application file for complete search history.

(56) References Cited

U.S. PATENT DOCUMENTS 6,493,266 B1 * 12/2002 Yachareni et al. ...... 365/185.22
7,002,846 B2 * 2/2006 Okimoto et al. ........ 365/185.19
7,349,278 B2 * 3/2008 Min et al. ................... 365/222
7,542,344 B2 * 6/2009 Kim ....................... 365/185.12

FOREIGN PATENT DOCUMENTS

KR       1020040007339 A       1/2004

* cited by examiner

*Primary Examiner*—Connie C Yoha
(74) *Attorney, Agent, or Firm*—Townsend and Townsend and Crew LLP

(57) ABSTRACT

A flash memory device includes a plurality of memory cell blocks, a control unit, a program speed calculation unit, a voltage generator and a block select unit. Each memory cell block includes a string having a drain select transistor, a plurality of memory cells, a novel cell and a source select transistor. The control unit generates a block select signal in response to an address signal and generates an operation control signal in response to a command signal. The program speed calculation unit decides a level of an initial program voltage based on threshold voltages detected after a program operation of the novel cells. The voltage generator generates operating voltages including the initial program voltage of the level according to the operation control signal. The block select unit transfers the operating voltages to a memory cell block corresponding to the block select signal.

20 Claims, 2 Drawing Sheets

FLASH MEMORY DEVICE AND OPERATING METHOD THEREOF

CROSS-REFERENCES TO RELATED APPLICATIONS

The present application claims priority to Korean patent application number 10-2007-0136299, filed on Dec. 24, 2007, which is incorporated by reference in its entirety.

BACKGROUND OF THE INVENTION

The present invention relates to a flash memory device and an operating method thereof and, more particularly, to a flash memory device related to a program operation for storing data in a memory cell and an operating method thereof.

A flash memory device is a representative non-volatile memory device which can retain data when power is off. The flash memory device can be classified into a NOR type flash memory device and a NAND type flash memory device according to the structure of a memory cell array. In the NAND type flash memory device, a memory cell array is divided into a plurality of memory cell blocks, each of which includes a plurality of strings. Each string includes a drain select transistor, a plurality of memory cells and a source select transistor, which are connected in series through junction regions (source or drain). The drain of the drain select transistor is connected to a bit line and the source of the source select transistor is connected to a common source line. The gates of the drain select transistors belonging to different strings are connected to become a drain select line, the control gates of the memory cells are connected to become a word line, and the gates of the source select transistors are connected to become a source select line. That is, memory cells included in different strings share one word line, which is defined as a page unit.

In recent years, in the NAND type flash memory device, a multi-level cell (MLC) device for storing 2-bits or more of data in one memory cell has been developed. In the case where 1-bit (0 or 1) data is stored in one memory cell, when the threshold voltage is higher than 0V, 0 data is stored in the memory cell, but when the threshold voltage is lower than 0V, 1 data is stored in the memory cell. However, in the case where four data (for example, 11, 10, 00 and 01) represented by 2 bits is stored in one memory cell, three data (for example, 10, 00 and 01) are classified as threshold voltages higher than 0V. In other words, since three data has to be represented by a threshold voltage higher than 0V within a limited range, the threshold voltages for classifying the respective data must be classified clearly. For this purpose, the respective threshold voltages must be distributed in a narrow range and the distance of the threshold voltages must be wide. If the distribution of the respective threshold voltages is wide or the distance of the threshold voltages is narrow, a malfunction may occur during a read operation.

Thus, in order to store 2-bit data, the program operation must be controlled accurately by checking program characteristics such as the program speed of a memory cell.

BRIEF SUMMARY OF THE INVENTION

The present invention is directed towards a flash memory device and an operating method thereof, in which program characteristics of memory cells, such as the program speed of the memory cells, are first sensed and the levels of biases for programming of the memory cells are then set based on the sensed results, thereby narrowing the distributions of threshold voltages of the programmed memory cells.

A flash memory device according to an aspect of the present invention includes a plurality of memory cell blocks, a control unit, a program speed calculation unit, a voltage generator and a block select unit. The memory cell block includes a string having a drain select transistor, a plurality of memory cells, a novel cell and a source select transistor. The control unit generates a block select signal in response to an address signal and generates an operation control signal in response to a command signal. The program speed calculation unit decides a level of an initial program voltage, which is first applied in a program operation of an ISPP(Incremental Step Pulse Program) method, based on threshold voltages detected after a program operation of the novel cells. The voltage generator generates operating voltages including the initial program voltage of a level according to the operation control signal. The block select unit transfers the operating voltages to a memory cell block corresponding to the block select signal.

The novel cell may be connected between the memory cell and the source select transistor, between the memory cell and the drain select transistor, or between the memory cells.

The program speed calculation unit may decide a voltage, which corresponds to an average value of the threshold voltages of the novel cells, as the initial program voltage; a voltage, which corresponds to 70% to 80% of threshold voltage distributions of the novel cells, as the initial program voltage; or a voltage, which corresponds to 20% to 30% of threshold voltage distributions of the novel cells, as the initial program voltage.

A method of operating a flash memory device according to another aspect of the present invention includes providing a memory cell block including strings each including a drain select transistor, a plurality of memory cells, a novel cell and a source select transistor; performing a program operation of the novel cells; deciding a level of an initial program voltage, which is first applied in a program operation of an ISPP method, based on threshold voltage distributions of the novel cells; and performing the program operation of the memory cells according to the ISPP method by employing the initial program voltage.

The program operation of the novel cells may be performed according to the ISPP method while increasing a program voltage.

The level of the initial program voltage may be decided as an average value of the threshold voltages of the novel cells, a voltage corresponding to 70% to 80% of the threshold voltage distributions of the novel cells, or a voltage corresponding to 20% to 30% of the threshold voltage distributions of the novel cells.

An erase operation of the novel cells may be further performed before the program operation of the memory cells is performed. The erase operation of the novel cells may be performed on a per memory-cell-block basis. When the erase operation of the novel cells is performed, word lines to which the memory cells may be connected are set to a floating state.

The program operation of the memory cells may include a LSB(Least Significant Bit) program operation and a MSB (Most Significant Bit) program operation in order to store 2-bit data.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
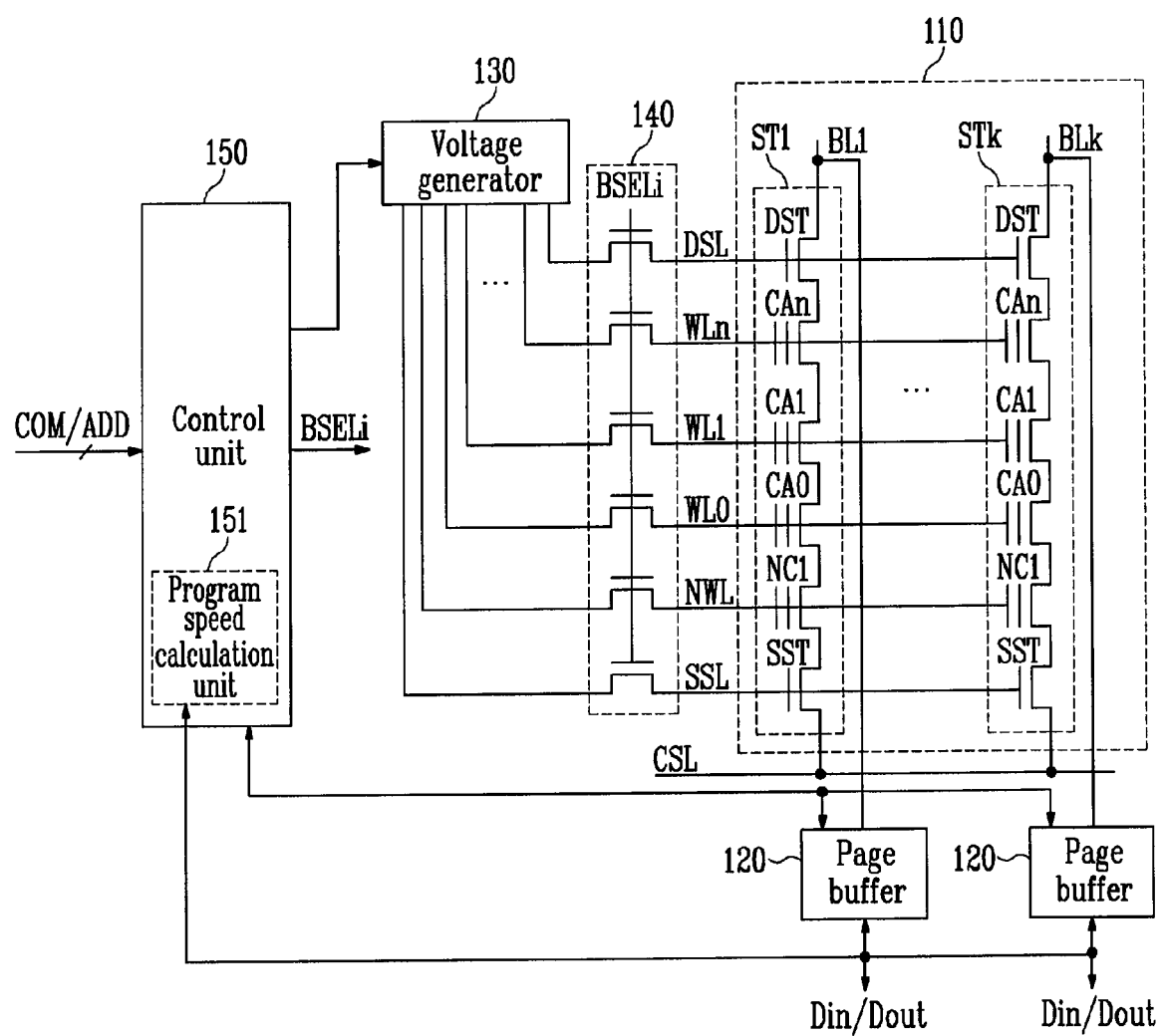
FIG. 1 is a circuit diagram illustrating a flash memory device according to an embodiment of the present invention.

FIG. 1 is a circuit diagram illustrating a flash memory device according to an embodiment of the present invention.

Referring to FIG. 1, a flash memory device includes a memory cell array 110, a page buffer 120, a voltage generator 130, a block select unit 140 and a control unit 150.

The memory cell array 110 includes a plurality of memory cell blocks (only one is shown for convenience of description). The memory cell block includes a plurality of strings ST1 to STk. Each string ST1 includes a drain select transistor DST, memory cells CA0 to CAn, a source select transistor SST and a novel cell NC1, all of which are connected in series. The novel cell NC1 may be connected between the source select transistor SST and the memory cell CA0, between the drain select transistor DST and the memory cell CAn, or between the memory cells. The novel cell NC1 is preferably connected between the source select transistor SST and the memory cell CA0.

The drain of the drain select transistor DST is connected to a bit line BL1, and the source of the source select transistor SST is connected to a common source line CSL. The gates of the drain select transistors DST included in different strings are connected to become a drain select line DSL, control gates of memory cells (for example, CA0 to CK0) are connected to become a word line WL0, and the gates of the source select transistors SST are connected to become a source select line SSL. That is, the memory cells CA0 to CK0 included in different strings share one word line WL0, which is defined as a page unit. The novel cell NC1 has the same structure as that of the memory cell. The control gates of the novel cells NC1 to NCk are connected to become a novel word line NWL.

The control unit 150 generates operation control signals for a program operation, an erase operation and a read operation in response to a command signal COM. The control unit 150 also outputs a block select signal BSELi for selecting one of a plurality of memory cell blocks in response to an address signal ADD.

In particular, in the present invention, the control unit 150 further includes a program speed calculation unit 151 for detecting the program speed of a memory cell. The function and operation of the program speed calculation unit 151 is described later on.

The voltage generator 130 outputs voltages for a program operation, an erase operation and a read operation at a variety of levels according to a control signal output from the control unit 150.

The block select unit 140 (only one is shown for convenience of description) is provided for as many as the number of memory cell blocks of the memory cell array 110. The block select unit 140 includes switching elements connected to each of the drain select line DSL, the word lines WL0 to WLn, the novel word line NWL and the source select line SSL. The switching elements are operated in response to the block select signal BSELi. Switching elements of the block select unit 140 corresponding to a selected memory cell block are turned on in response to the block select signal BSELi and transfer operating voltages, which are generated from the voltage generator 130, to the drain select line DSL, the word lines WL0 to WLn, the novel word line NWL and the source select line SSL.

The page buffer 120 is connected to the bit line BL1 and performs an operation for storing data in a memory cell (for example, bit line precharge) or an operation for reading data stored in a memory cell (for example, bit line voltage sensing) under the control of the control unit 150.

The flash memory device of the present invention is configured to measure the program speed of a memory cell during a program operation and to control the level of an operating voltage necessary for the program operation based on the measured result. For example, the flash memory device of the present invention performs a program operation on the novel cells NC1 to NCk, detects a change width of threshold voltages of the novel cells NC1 to NCk, and determines the program speed of memory cells (for example, a change width of the threshold voltage) based on the resulting value. Initial levels of operating voltages applied to program the memory cells (for example, program voltages applied to a word line) are set according to the determined program speed. This is described in more detail below.

Figure 2:
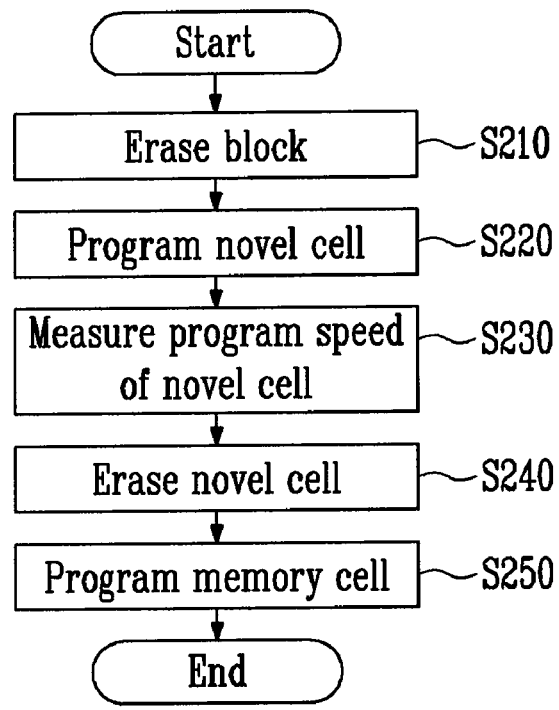
FIG. 2 is a flowchart illustrating a method of operating a flash memory device according to an embodiment of the present invention.
Figure 3:
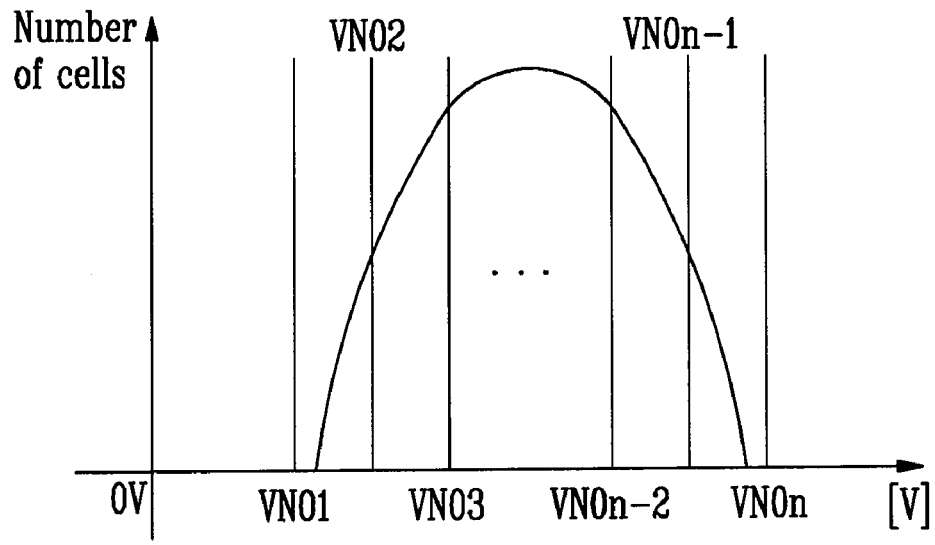
FIG. 3 is a graph illustrating a method of measuring the program speed according to an embodiment of the present invention.

FIG. 2 is a flowchart illustrating a method of operating a flash memory device according to an embodiment of the present invention. FIG. 3 is a graph illustrating a method of measuring the program speed according to an embodiment of the present invention.

Referring to FIGS. 1 and 2, before a program operation is performed, an erase operation of a selected memory cell block is performed in step S210. The threshold voltages of the memory cells CA0 to CAn and CK0 to CKn and the novel cells NC1 to NCk become lower than 0V through the erase operation. After the erase operation is performed, a soft program operation can be performed so that the distribution of the threshold voltages is narrowed while the threshold voltages of the cells, which are lower than 0V, approach 0V. In general, the program operation is performed on a per page basis, but the soft program operation is performed to program all of the cells at the same time by applying a soft program voltage to all of the word lines WL0 to WLn and the novel word line NWL. The soft program voltage is lower than a program voltage (for example, 1V to 10V) applied in a typical program operation. If the soft program operation is performed by applying the soft program voltage, the threshold voltage of a memory cell whose threshold voltage is much lower than 0V increases greatly and the threshold voltage of a memory cell whose threshold voltage is slightly lower than 0V increases slightly. Consequently, the distribution of the threshold voltages of the cells is narrowed while the threshold voltages of the cells approach 0V.

A program operation is performed on the novel cells NC1 to NCk in step S220. The program operation of the novel cells NC1 to NCk is preferably performed under the same condition as that of the program operation of a general memory cell. The program operation of the novel cells NC1 to NCk is performed not to store data in the novel cells NC1 to NCk, but to measure the program speed of the novel cells NC1 to NCk, such that all of the novel cells NC1 to NCk are programmed. Thus, when the program operation of the novel cells NC1 to NCk is performed, all of the bit lines BL1 to BLk are applied with a ground voltage from the page buffer 120. The voltage generator 130 applies a pass voltage to the word lines WL0 to WLn so that the memory cells CA0 to CAn and CK0 to CKn are activated, applies a power supply voltage to the drain select line DSL, and applies a ground voltage to the source select line SSL through the block select unit 140. In this state, if the novel word line NWL is applied with a program voltage, the threshold voltages of the novel cells NC1 to NCk increase. The program voltage applied to the novel word line NWL may be set in the range of 9V to 35V.

After the program operation is performed on the novel cells NC1 to NCk, the program speed of the novel cells NC1 to NCk is measured in step S230. For example, the program speed of the novel cells NC1 to NCk can be measured as a change in width (e.g. an increased width) of the threshold voltage of the novel cells NC1 to NCk. This is described in more detail below.

Referring to FIGS. 1 and 3, the threshold voltage of the novel cells NC1 to NCk increases higher than 0V by the program operation. In other words, the program operation of the novel cells NC1 to NCk is performed by applying a high program voltage to the extent that the threshold voltage of the novel cells NC1 to NCk becomes higher than 0V. Thereafter, in order to measure the distribution of the threshold voltage of the novel cells NC1 to NCk, a detection operation is carried out. The detection operation can be performed in the same manner as a read operation and is performed using a plurality of compare voltages VN01 to VN0$n$. This is described in more detail below.

As the number of the compare voltages VN01 to VN0$n$ increases, the distribution of the threshold voltage of the novel cells NC1 to NCk can be detected more accurately. However, since time taken to perform the detection operation increases when the number of the compare voltages is large, an adequate number of the compare voltages VN01 to VN0$n$ can be set by taking both the accuracy and time of the detection operation into consideration. During the detection operation, the bit lines BL0 to BLk are precharged to a specific level (for example, Vcc) and the lines DSL, WL0 to WLn and SSL are each applied with voltages for turning on the transistors DST and SST and the memory cells CA0 to CAn and CK0 to CKn. Further, the novel word line NWL is applied with the first compare voltage VN01. A novel cell having a threshold voltage higher than the first compare voltage VN01 is turned off, and novel cells having threshold voltages lower than the first compare voltage VN01 are turned on. If the novel cell is turned on, the voltage precharged to the bit lines is discharged through the common source line CSL. The page buffers 120 detect a voltage change of the bit lines BL1 to BLk and transfer the resulting detection values to the control unit 150. The resulting detection values received from the page buffers 120 are stored in a temporary storage means (for example, a register) included in the control unit 150. For example, the number of novel cells having a threshold voltage higher than a compare voltage can be stored as the resulting detection value. The level of the threshold voltage of the novel cells NC1 to NCk is detected while changing the compare voltage up to the compare voltage VN0$n$ in this manner, and the resulting values are stored in the temporary storage means of the control unit 150.

After the detection operation is finished, the program speed calculation unit 151 of the control unit 150 detects the program speed of the memory cells based on threshold voltage distributions of the novel cells NC1 to NCk corresponding to the resulting detection values and decides the level of a program voltage, which will be applied first when programming the memory cells. For example, an average threshold voltage of the novel cells NC1 to NCk can be defined as a program voltage to be applied initially (hereinafter, referred to as "an initial program voltage") according to the resulting detection value. For example, a threshold voltage, which corresponds to 70% to 80% of threshold voltage distributions of the novel cells NC1 to NCk, can be defined as the initial program voltage and a threshold voltage, which corresponds to 20% to 30% of threshold voltage distributions of the novel cells NC1 to NCk, can be defined as the initial program voltage.

It has been described above that the program method is a single pulse program method of applying the program voltage only once when the program operation of the novel cells NC1 to NCk is performed. However, the program method can be performed using an ISPP (Increment Step Pulse Programming) method. For example, after the novel cells NC1 to NCk are programmed by applying a program voltage to the novel word line NWL as many as a predetermined number while increasing the program voltage in 0.1V to 3V increments within a range of 9V to 35V, threshold voltage distributions of the novel cells NC1 to NCk can be detected. In the event that the novel cells NC1 to NCk are programmed using the ISPP method as described above, the program operation condition of the novel cells NC1 to NCk can be set to the same voltage condition as that when the memory cells are programmed using the ISPP method.

After the initial program voltage of the program operation is decided through the detection operation of the program speed employing the novel cells NC1 to NCk, the program operation of the memory cells is performed. The novel cells NC1 to NCk whose threshold voltage has become higher than 0V due to the program operation may have an effect on the program operation of the memory cells CA0 to CAn. For this reason, it may be preferred that an erase operation of the novel cells NC1 to NCk is performed before the program operation of the memory cells in step S240. The erase operation is generally performed on a per block basis and, therefore, the erase operation of the novel cells NC1 to NCk can also be performed on a per block basis. If the erase operation is performed again, the threshold voltage of the memory cells CA0 to CAn and CK0 to CKn can be further lowered since the memory cells CA0 to CAn and CK0 to CKn are in an erase state. Thus, it may be preferred that when the erase operation of the novel cells NC1 to NCk is performed, the word lines WL0 to WLn maintain a floating state. By doing so, when an erase voltage is applied to a bulk (for example, a P well) of the memory cells CA0 to CAn and CK0 to CK, the voltage of the word lines WL0 to WLn is also increased due to a capacitor coupling phenomenon, so the erase operation of the memory cells CA0 to CAn and CK0 to CK is rarely generated.

After the erase operation of the novel cells NC1 to NCk is performed, the program operation of the memory cells is carried out in step S250. The program operation of the memory cells CA0 to CAn and CK0 to CKn can also be performed using the ISPP method. In the present invention, when the memory cells are programmed according to the ISPP method, an initial program voltage decided by the program speed calculation unit 151 of the control unit 150 is applied first. Further, 2-bit data can be stored in one memory cell by performing a LSB program operation and a MSB program operation. Specifically, this is described below with reference to an example in which the memory cell CA0 of the first string ST1 is a to-be-programmed cell and the memory cell CK0 of the second string ST2 is a program-inhibited cell in FIG. 1.

In the program operation of the ISPP method, an initial program voltage to be applied first is decided. After the novel cells NC1 to NCk are erased, the program operation of the memory cells CA0 to CK0 sharing the first word line WL0 is performed according to the ISPP method. The first bit line BL1 connected to the first string ST1, including the memory cell CA0 to be programmed, is applied with a ground voltage and the second bit line BLk connected to the second string STk including the program-inhibited cell CK0 is applied with a program-inhibited voltage Vcc. The program-inhibited voltage Vcc is applied in order to increase a channel voltage by generating channel boosting in a channel region within the second string STk in a subsequent operation. This is described in more detail later on.

Thereafter, the drain select line DSL is applied with a power supply voltage and the source select line SSL is applied with a ground voltage. The remaining word lines WL1 to WLn are applied with a pass voltage of a degree in which the memory cells are turned on. If the pass voltage is applied, a channel boosting phenomenon in which the voltage of the channel region rises is generated within the second string STk due to a capacitor coupling phenomenon. Consequently, the voltage of the channel region increases within the second string STk, and the drain select transistor DST within the second string STk is turned off by a potential between the gate and source or drain. In the first string ST1, the drain select transistor DST remains turned on since the first bit line BL1 is applied with the ground voltage, but the voltage of the channel region does not increase.

In this state, the initial program voltage decided by the program speed calculation unit 151 of the control unit 150 is applied to the first word line WL0. Due to the initial program voltage, the memory cell CA0 of the first string ST1 is programmed by a high potential between the word line WL0 and the channel region. In other words, electrons are injected into the floating gate of the memory cell CA0 by FN tunneling, so the threshold voltage increases. The program-inhibited cell CK0 of the second string STk is not programmed because the voltage of the channel region increases due to channel boosting, and a potential between the word line WL0 and the channel region is low accordingly.

After the first program operation is performed by applying the initial program voltage, a first verify operation for verifying whether the threshold voltage of the memory cell CA0 has increased to a target voltage is performed. If it is verified that the threshold voltage of the memory cell CA0 has not increased to the target voltage, the level of the initial program voltage is increased and a second program operation is then performed. A second verify operation is then performed in order to detect the threshold voltage level of the memory cell CA0. It may be preferred that the program voltage is increased to a maximum of 35V and an increment width is decided within a range of 0.1V to 3V. If the threshold voltage of the memory cell CA0 increases to the target voltage, the program operation of the ISPP method is finished.

In the case where 2-bit data is stored in one memory cell, the above program operation of the ISPP method becomes a LSB program operation. A MSB program operation is performed subsequently. The MSB program operation can also be performed according to the ISPP method. An initial program voltage decided by the program speed calculation unit 151 of the control unit 150 can be applied as a start voltage of the MSB program operation.

The program operation of the memory cells sharing the remaining word lines is performed in the same manner as above.

As described above, according to the present invention, before the program operation of memory cells is performed, program characteristics of the memory cells are checked and the program operation is then performed in response to the checked program characteristics. Accordingly, threshold voltage distributions of the memory cells can be narrowed.

Further, the level of biases applied at the time of a program operation is controlled. Accordingly, degradation in program characteristics due to an abrupt change in the bias can be prevented and an increase in an overall program operation time can be prevented.

The present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

What is claimed is:

1. A flash memory device comprising:
    a plurality of memory cell blocks including strings, each string including a drain select transistor, a plurality of memory cells, a novel cell and a source select transistor;
    a control unit for generating a block select signal in response to an address signal and for generating an operation control signal in response to a command signal;
    a program speed calculation unit for determining a level of an initial program voltage based on threshold voltages detected after a program operation of the novel cells, wherein the initial program voltage is applied in a program operation of an increment step pulse programming (ISPP) method;
    a voltage generator for generating operating voltages including the initial program voltage according to the operation control signal, wherein a level of the initial program voltage is determined by the program speed calculation unit; and
    a block select unit that transfers the operating voltages to a memory cell block corresponding to the block select signal.

2. The flash memory device of claim 1, wherein the novel cell is connected between the memory cell and the source select transistor.

3. The flash memory device of claim 1, wherein the novel cell is connected between the memory cell and the drain select transistor.

4. The flash memory device of claim 1, wherein the novel cell is connected between the memory cells.

5. The flash memory device of claim 1, wherein the program speed calculation unit determines the initial program voltage, wherein the determined initial program voltage corresponds to an average value of the threshold voltages of the novel cells.

6. The flash memory device of claim 1, wherein the program speed calculation unit determines the initial program voltage, wherein the determined initial program voltage corresponds to 70% to 80% of threshold voltage distributions of the novel cells.

7. The flash memory device of claim 1, wherein the program speed calculation unit determines the initial program voltage, wherein the determined initial program voltage corresponds to 20% to 30% of threshold voltage distributions of the novel cells.

8. A method of operating a flash memory device, the method comprising:
    providing a memory cell block including strings, wherein each string comprises a drain select transistor, a plurality of memory cells, a novel cell and a source select transistor;
    performing a program operation on the novel cells;

determining a level of an initial program voltage based on threshold voltage distributions of the novel cells, wherein the initial program voltage is applied to erased memory cells in a program operation of an ISPP method to raise threshold voltages of the erased memory cells; and performing the program operation of the erased memory cells according to the ISPP method by employing the initial program voltage.

9. The method of claim 8, wherein the program operation of the novel cells is performed according to the ISPP method while increasing a program voltage.

10. The method of claim 8, wherein the level of the initial program voltage is determined to be an average value of the threshold voltages of the novel cells.

11. The method of claim 8, wherein the level of the initial program voltage is determined to be a voltage corresponding to 70% to 80% of the threshold voltage distributions of the novel cells.

12. The method of claim 8, wherein the level of the initial program voltage is determined to be a voltage corresponding to 20% to 30% of the threshold voltage distributions of the novel cells.

13. The method of claim 8, further comprising performing an erase operation on the novel cells before the program operation of the memory cells is performed.

14. The method of claim 13, wherein the erase operation of the novel cells is performed on a per memory-cell-block basis.

15. The method of claim 14, wherein when the erase operation of the novel cells is performed, word lines to which the memory cells are connected are set to a floating state.

16. The method of claim 8, wherein the program operation of the memory cells includes a LSB program operation and a MSB program operation in order to store 2-bit data.

17. A method of operating a flash memory device, the method comprising:

providing a memory cell block including strings, wherein each string comprises a drain select transistor, a plurality of memory cells, a novel cell and a source select transistor;

performing a program operation on the novel cells;

determining a program speed of the novel cells;

determining a program speed at which erased memory cells are programmed, based on the determined program speed of the novel cells;

setting initial program voltages to be used to raise threshold voltages of the erased memory cells, based on the determined program speed of the erased memory cells; and performing the program operation of the erased memory cells by employing the initial program voltages.

18. The method of claim 17, wherein determining a program speed of the novel cells comprises detecting a change in threshold voltages distributions of the novel cells.

19. The method of claim 17, wherein the program operation is performed on the novel cells according to an ISPP method while increasing a program voltage.

20. The method of claim 17, wherein performing the program operation of the memory cells comprises applying the initial program voltages to the memory cells using an ISPP method.

* * * * *